United States Patent
Kodama et al.

(10) Patent No.: US 10,360,101 B2
(45) Date of Patent: Jul. 23, 2019

(54) MEMORY CONTROLLER AND DATA READING METHOD

(71) Applicant: Toshiba Memory Corporation, Minato-ku (JP)

(72) Inventors: Tomoya Kodama, Kawasaki (JP); Takayuki Itoh, Kawasaki (JP); Atsushi Matsumura, Yokohama (JP); Takuya Matsuo, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 127 days.

(21) Appl. No.: 15/703,454

(22) Filed: Sep. 13, 2017

(65) Prior Publication Data

US 2018/0276072 A1    Sep. 27, 2018

(30) Foreign Application Priority Data

Mar. 21, 2017 (JP) .................................. 2017-053903

(51) Int. Cl.
 *G06F 11/10* (2006.01)
 *G11C 16/04* (2006.01)
 *G11C 16/26* (2006.01)

(52) U.S. Cl.
 CPC ...... *G06F 11/1068* (2013.01); *G06F 11/1016* (2013.01); *G11C 16/04* (2013.01); *G11C 16/26* (2013.01); *G06F 11/1072* (2013.01)

(58) Field of Classification Search
 CPC ............ G06F 11/1068; G06F 11/1016; G06F 11/1072; G11C 16/04; G11C 16/26
 USPC ............... 714/699, 701, 702, 704, 718, 719; 365/185.03, 185.07, 185.09, 185.12, 184, 365/187, 200, 201, 210.12
 See application file for complete search history.

(56) References Cited

U.S. PATENT DOCUMENTS

| 7,525,839 B2 * | 4/2009 | Shibata ............... G11C 11/5642 365/185.03 |
| 8,050,086 B2 | 11/2011 | Shalvi et al. |
| 8,891,296 B2 * | 11/2014 | Ma ..................... G11C 16/3431 365/185.02 |

(Continued)

OTHER PUBLICATIONS

Eun-Seok Choi et al., "Device Considerations for High Density and Highly Reliable 3D NAND Flash Cell in Near Future," Electron Devices Meeting (IEDM), 2012 IEEE International, 2012, pp. 4.

*Primary Examiner* — John J Tabone, Jr.
(74) *Attorney, Agent, or Firm* — Oblon, McClelland, Maier & Neustadt, L.L.P.

(57) ABSTRACT

According to one embodiment, a memory controller includes one or more processors configured to function as a writing unit and a reading unit. The writing unit writes data as threshold voltages of individual memory cells. The reading unit reads the written data by detecting threshold voltages of the individual memory cells. The reading unit includes a selecting unit, a detecting unit, and an estimating unit. The selecting unit selects a read-target memory cell. The detecting unit detects a first threshold voltage at a time of reading of the read-target memory cell, and a second threshold voltage at a time of reading of at least one of adjacent memory cells that are adjacent to the read-target memory cell. The estimating unit estimates a third threshold voltage as a threshold voltage at a time of writing in the read-target memory cell based on the first threshold voltage and the second threshold voltage.

9 Claims, 6 Drawing Sheets (56) References Cited

U.S. PATENT DOCUMENTS

2007/0279982 A1* 12/2007 Shibata ............... G11C 11/5642
                                                  365/185.03
2017/0300252 A1* 10/2017 Yim ..................... G06F 3/0619

* cited by examiner

MEMORY CONTROLLER AND DATA READING METHOD

CROSS-REFERENCE TO RELATED APPLICATIONS

This application is based upon and claims the benefit of priority from Japanese Patent Application No. 2017-053903, filed on Mar. 21, 2017; the entire contents of which are incorporated herein by reference.

FIELD

Embodiments described herein relate generally to a memory controller and a data reading method.

BACKGROUND

According to improvement in storage density of a NAND flash memory used in a solid state drive (SSD) and a memory card, reliability thereof has become an issue. For example, when a distance between memory cells becomes short due to downscaling, threshold voltages of the memory cells are affected by interference between adjacent memory cells (CCI: Cell-to-Cell interference) at the time of writing the threshold voltage to the memory cells. Further, it has been pointed out that a three-dimensional flash memory has a strong tendency that the threshold voltage deviates with passage of time, as compared to a conventional two-dimensional flash memory, and improvement in retention capacity of data (data retention) is required.

As a method of improving the reliability of flash memories, there is a method of calculating a cross coupling coefficient by using hard-decision error correction with respect to a memory cell in which its threshold voltage has changed due to various factors, and reconfiguring the threshold voltage based on the cross coupling coefficient. However, in this method, there are many cases where occurrence of errors cannot he sufficiently suppressed. For example, in many three-dimensional flash memories, a structure referred to as "charge trap structure" is employed. In the case of this structure, the data retention is affected by the threshold voltages of adjacent memory cells. Therefore, the error rate of read page data is varied for each bit, and occurrence of errors cannot be sufficiently suppressed only by using a uniform coefficient.

BRIEF DESCRIPTION OF THE DRAWINGS

FIG. is an explanatory diagram of a data storage structure of a memory array.

DETAILED DESCRIPTION

In general, according to one embodiment, a memory controller includes one or more processors configured to function as a writing unit and a reading unit. The writing unit is configured to write data as threshold voltages of individual memory cells of a memory cell group. The reading unit is configured to read the written data by detecting threshold voltages of the individual memory cells of the memory cell group. The reading unit includes a selecting unit, a detecting unit, and an estimating unit. The selecting unit is configured to select a read-target memory cell. The detecting unit is configured to detect first threshold voltage as a threshold voltage at a time of reading of the read-target memory cell, and a second threshold voltage as a threshold voltage at a time of reading of at least one of adjacent memory cells that are adjacent to the read-target memory cell. The estimating unit is configured to estimate a third threshold voltage as a threshold voltage at a time of writing in the read-target memory cell based on the first threshold voltage and the second threshold voltage.

Embodiments of a memory controller and a data reading method will be explained below in detail with reference to the accompanying drawings. In the following descriptions, constituent elements having a mutually identical function are denoted by like reference signs and redundant explanations thereof will be omitted.

First Embodiment

Figure 1:
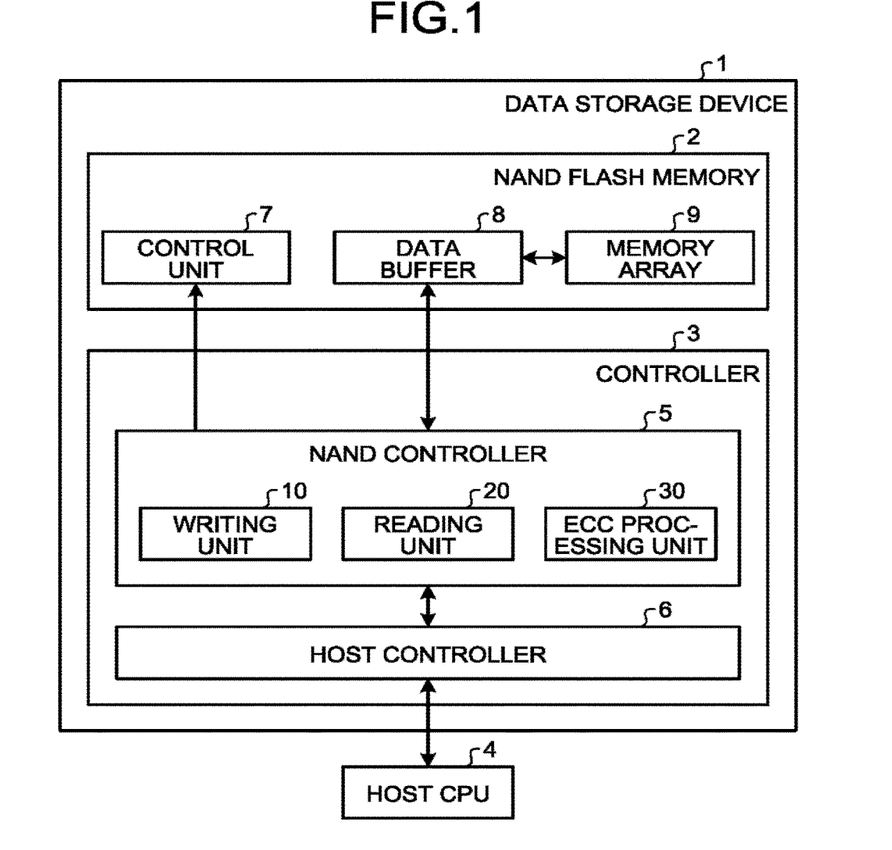
FIG. 1 is a block diagram illustrating a configuration example of a data storage device.

FIG. 1 is a block diagram illustrating a configuration example of a data storage device I including a memory controller according to a first embodiment. The data storage device 1 illustrated in FIG. 1 includes a NAND flash memory 2 and a controller 3, and operates according to a command from a host CPU 4.

All write commands and read commands the host CPU 4 to the data storage device 1 are transmitted to the controller 3. The controller 3 controls the NAND flash memory 2 according to a command from the host CPU 4, and writes data to the NAND flash memory 2 or reads data from the NAND flash memory 2. In FIG. 1, an example in which the NAND flash memory 2 and the controller 3 correspond to each other on a one-to-one basis is illustrated. However, a configuration in which the controller 3 controls a plurality of NAND flash memories 2 can be also employed.

The controller 3 includes a NAND controller 5 and a host controller 6, The controller 3 or the NAND controller 5 in the controller 3 corresponds to the memory controller according to the present embodiment.

The host controller 6 performs transmission and reception of data according to a command issued from the host CPU 4. Specifically, the host controller 6 performs a process of converting address information (generally referred to as LBA: Logical Block Address) indicated by the host CPU 4 into an address space in the NAND flash memory 2.

The NAND controller 5 controls the NAND flash memory 2 based on a signal transmitted from the host controller 6. Specifically, the NAND controller 5 sends commands and addresses to the NAND flash memory 2 to perform writing and reading of data.

The NAND controller 5 includes a writing unit 10, a reading unit 20, and an error correction code (ECC) processing unit 30.

The writing unit 10 sends commands and address information or sends user data to be written to the NAND flash memory 2, thereby writing data in the NAND flash memory 2. The user data transmitted from the host CPU 4 is added with an error correction code by the ECC processing unit 30 and converted into data to be written in the NAND flash memory 2. A process of randomizing data after the addition of the error correction code may be added for the purpose of leveling write/erase stress.

Writing of data to the NAND flash memory 2 is performed by setting the threshold voltage of each individual memory cell of a memory cell group according to the address information to a voltage level corresponding to the user data. That is, the user data is written as threshold voltages of the individual memory cells of the memory cell group.

The reading unit 20 reads data from the NAND flash memory 2 by sending a command and address information to the NAND flash memory 2. Error correction is performed on the data read from the NAND flash memory 2 by the ECC processing unit 30.

Reading of data om the NAND flash memory 2 is performed by detecting the threshold voltages of the individual memory cells of the memory cell group in which the user data according to the address information is written. The threshold voltage of the memory cell of the NAND flash memory 2 is varied by various factors. However, in the present embodiment, with regard to the individual memory cells of the memory cell group in which the user data is written, the threshold voltages at the time of writing are estimated based on the threshold voltages detected at the time of reading, to thereby reproduce the user data. This makes it possible to efficiently suppress error.

Figure 2:
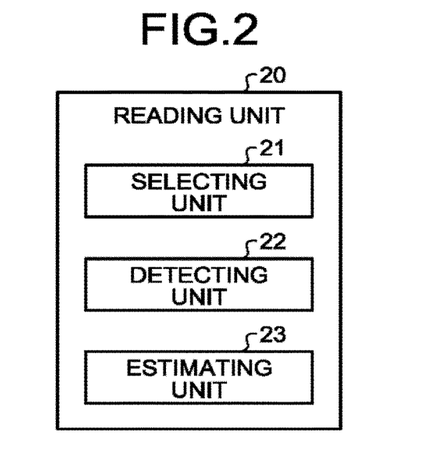
FIG. 2 is a block diagram illustrating a configuration example of a reading unit.

FIG. 2 is a block diagram illustrating a configuration example of the reading unit 20 according to the present embodiment. For example, as illustrated in FIG. 2, the reading unit 20 includes a selecting unit 21, a detecting unit 22, and an estimating unit 23.

The selecting unit 21 sequentially selects a memory cell to be read (hereinafter, "read-target memory cell") of the memory cell group in the NAND flash memory 2 in which the user data has been written.

The detecting unit 22 detects a first threshold voltage as a (present) threshold voltage at the time of reading the read-target memory cell selected by the selecting unit 21, and a second threshold voltage as a (present) threshold voltage at the time of reading at least one memory cell being adjacent to the read-target memory cell.

The estimating unit 23 estimates a third threshold voltage as a threshold voltage at the time of writing in the read-target memory cell based on the first threshold voltage and the second threshold voltage detected by the detecting unit 22.

For example, when an error is included in the data read from the NAND flash memory 2, the reading unit 20 according to the present embodiment can reproduce the user data by performing processing by the selecting unit 21, the detecting unit 22, and the estimating unit 23 on the memory cell of the memory cell group in the NAND flash memory 2 in which the user data has been written. Note that a result of reading by using a predetermined read command can be sent to the ECC processing unit 30 before starting that processing, and when it is confirmed that there is no uncorrectable error, the subsequent processing can be omitted to realize high-speed reading.

The NAND flash memory 2 includes a control unit 7, a data buffer 8, and a memory array 9. The control unit 7 interprets the commands and the address information issued from the controller 3 to control the data buffer 8 and the memory array 9. The user data is temporarily accumulated in the data buffer 8 and then written in the memory array 9. In the case of reading, the data read from the memory array 9 is temporarily stored in the data buffer 8, and sequentially transmitted to the controller 3.

Figure 3:
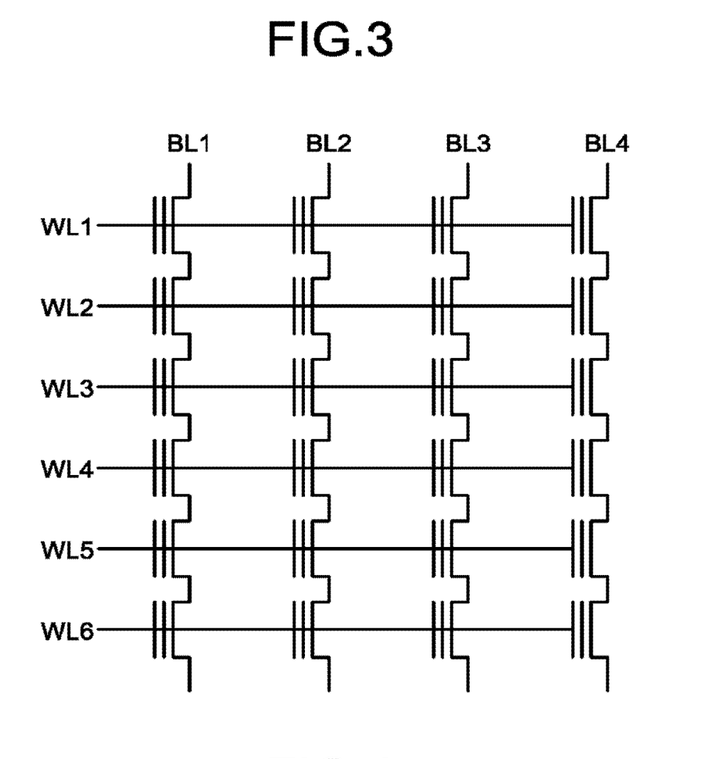
FIG. 3 is an explanatory diagram of a structure of a memory array in a NAND flash memory.

FIG. 3 is an explanatory diagram of a structure of the memory array 9 in the NAND flash memory 2. As illustrated in FIG. 3, the memory array 9 is configured by a plurality of circuits that are referred to as "NAND strings". In each NAND string, a plurality of transistors (each of the transistors is referred to as "memory cell") are arranged in series. One NAND string is referred to as "bit line (BL)". Gate electrodes of the transistors at the same position or a plurality of bit lines are connected to each other with a line referred to as "word line (WL)", In FIG. 3, only four bit lines of BL1 to BL4 and six word lines of WL1 to WL6 are illustrated. However, in an actual configuration, there are more bit lines and word lines, and a plurality of memory cells are arranged in array. In the NAND flash memory 2, information of about one bit to four bits is recorded in one memory cell (transistor) having a variable threshold voltage.

Data is written by the threshold voltage of a memory cell (transistor), and when the data is to be read, an appropriate voltage (this voltage is referred to as "readout voltage") is applied to the word line corresponding to the memory cell group from which data is to be read, and the voltages of the remaining word lines are set to a high level to check whether the threshold voltage of the individual memory cell (transistor) of the memory cell group from which data is to be read is higher or lower than the applied voltage. By repeating this process for plural times, the threshold voltages of all the memory cells on the corresponding word line are detected, and the data written in the word line is read.

As described above, there is a case where information of a plurality of bits is recorded in one memory cell. However, only one bit of the recorded bits is generally read. The data to be written in the respective memory cells as threshold voltages is subjected to encoding referred to as "gray code", in order to reduce as much as possible the number of times of checking the threshold voltage of the memory cell by applying the readout voltage to the word line.

Figure 4:
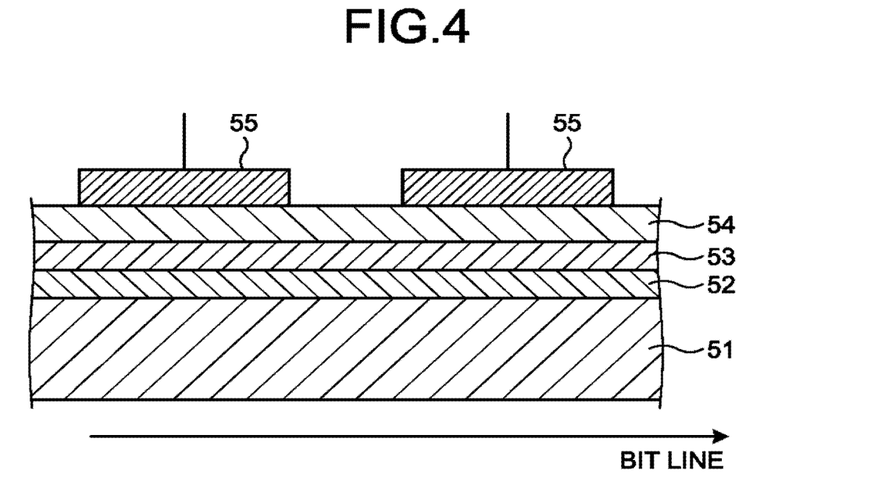
FIG. 4 is a sectional view illustrating a structure example of the memory cell in the NAND flash memory.

FIG. 4 is a sectional view illustrating a structure example of a memory cell in the NAND flash memory 2. In the recent three-dimensional NAND flash memory, a charge-trap memory cell as illustrated in FIG. 4 is used. The charge-trap memory cell has a structure in which a substrate 51, a tunnel layer 52, a charge trap layer 53, an insulation layer 54, and a control gate 55 are stacked in this order. In this structure, an electric charge is trapped in a defect formed in the charge trap layer 53 to change the threshold voltage of the memory cell. A high voltage pulse is provided between the control gate 55 and the substrate 51 in order to trap the electric charge for write or to detrap the trapped electric charge for deletion. The amount of the electric charge to be trapped in the charge trap layer 53, that is, the threshold voltage of the memory cell can be controlled by increasing or decreasing the number of voltage pulses. The charge-trap memory cell has a characteristic such that the charge trap layer 53 is connected to adjacent memory cells. Because the charge trap layer 53 is an insulator having a defect, the written electric charge is not transmitted immediately to the adjacent memory cells.

Threshold voltages if respective memory cells are varied due to various factors. For example, a phenomenon referred to as "cell-to-cell interference (CCI)" is a phenomenon in which a parasitic capacitance is generated not only in the memory cell to he written but also between the memory cell to be written and adjacent cells, and noise is superimposed on the threshold voltages of the adjacent cells at the time of writing data, due to a short distance between the adjacent cells. Furthermore, a phenomenon referred to as "read disturb" is a phenomenon in which an electric charge is slightly gained in the charge trap layer 53 from the substrate 51 by applying a high voltage to the word lines other than the word line corresponding to the memory cell to be read at the time of reading, and the threshold voltage is varied. Phenomena referred to as "program disturb" and "pass disturb" are phenomena in which the voltage between the control gate 55 and the substrate 51 increases even in other memory cells at the time of writing, and unintended writing of the electric charge occurs. Further, there is a phenomenon in which the electric charge trapped in the charge trap layer 53 leaks in a direction towards the substrate 51 and a direction towards adjacent cells over long time. That is, the time during which a memory cell can hold data is limited, and the retention capacity of data is referred to as "data retention".

According to the following reference literature, in a phenomenon of charge leakage relating to the data retention, three phenomena, i.e., tunneling, thermionic emission, and Poole-Frenkel emission, are dominant. (Reference literature) D. Oh, B. Lee, et al., "TCAD Simulation of Data Retention Characteristics of Charge Trap Device for 3-D NAND Flash Memory", IMW2015

The tunneling (Fowler-Nordheim (FN) tunneling) charge leakage that mainly occurs in the thin tunnel layer (tunnel film) between the charge trap layer 53 and the substrate 51, and a current density $J_{DT}$ thereof can be represented by the following expression (1).

$$J_{DT} \propto E^2 \exp\left(-\frac{A_{DT}}{E}\right) \quad (1)$$

In this expression, E denotes an electric field in the tunnel layer 52, which is proportional to the voltage between the tunnel layer 52 and the substrate 51, and inversely proportional to a film thickness of the tunnel layer 52. $A_{DT}$ is a parameter depending on the structure and the material of the device.

The thermionic emission is a phenomenon in which electric charges excited by heat move from a valance band to a conduction band, thereby causing leakage of electric charges to the control gate 55 (gate electrodes) and the substrate 51. A current density $J_{TE}$ thereof can be represented by the following expression (2).

$$J_{TE} \propto T^2 \left(\frac{A_{TE}\sqrt{E}}{T} - B_{TE}\right) \quad (2)$$

In this expression, T denotes a temperature, $A_{TE}$ and $B_{TE}$ are parameters depending on the structure and the material of the device.

Poole-Frenkel emission is a phenomenon with regard to the charge leakage mainly between the memory cell to be written and adjacent memory cells. If there is a potential difference between the memory cell to be written and an adjacent memory cell, that is, if a threshold voltage written in the adjacent memory cell and a threshold voltage written in the memory cell itself are different from each other, an electric field is generated between the memory cell to be written and the adjacent memory cell. Accordingly, mobility of the electric charge in the charge trap layer 53 increases, and the electric charge leaks in a bit line direction. A current density $J_{PF}$ thereof can be represented by the following expression (3).

$$J_{PF} \propto E_{PF} \exp\left(\frac{A_{PF}\sqrt{E_{PF}}}{T} - B_{PF}\right) \quad (3)$$

In this expression, $A_{PF}$ and $B_{PF}$ are parameters depending on the structure and the material of the device. $B_{PF}$ indicates an electric field applied between the adjacent memory cell and the memory cell to be written, which is proportional to the threshold voltage difference between the adjacent memory cell and the memory cell to be written, and is inversely proportional to a gap between memory cells.

As described above, the charge leakage relating to the data retention depends on the temperature, the threshold voltage written therein, and a difference between the threshold voltage written in the adjacent memory cell and the memory cell to be written. Therefore, in order to estimate the change amount of the threshold voltage with regard to the data retention based on the threshold voltage of the memory cell at a certain time, it is required to find the temperature from at the time of writing in the current time and the elapsed time, and estimate a total amount of charge leakage in a stacking direction between the control gate 55 and the substrate 51 and charge leakage in a direction to the adjacent memory cell.

The threshold voltage of the memory cell can be represented by the sum of a neutral threshold voltage when the charge trap layer 53 accumulates no charges, and threshold voltage differences changed due to charge injection. In the following descriptions, for the convenience sake, it is described that the neutral threshold voltage is set to 0.

When taking into consideration a disturbance of the threshold voltage caused by the cell-to-cell interference (CCI) described above, it can be considered that the threshold voltage at a certain time t (t represents an elapsed time since the time of writing) of a memory cell (x, y) located on a bit line x and a word line y can be represented by a threshold-voltage variation model represented by the following expression (4).

$$V_{th}(x, y; t) = V_{th}(x, y; 0) + w_{cci}V_{th}(x, y+1; 0) + \sum_{(i)\in(-1,+1)}(w_{pf}(t)(V_{th}(x, y; 0) - V_{th}(x, y+i; 0))) + w_{dt,te}(t)V_{th}(x, y; 0) \quad (4)$$

In this expression, $V_{th}(x, y;t)$ denotes a threshold voltage of the memory cell (x, y) at the time t, $V_{th}(x, y+i;0)$ denotes a threshold voltage of an adjacent memory cell adjacent to the memory cell (x, y) at the time of writing, $w_{cci}$ denotes a coefficient representing an influence quantity of the cell-to-cell interference (CCI), $w_{pf}(t)$ denotes a coefficient representing a cumulative influence quantity of Poole-Frenkel emission, and $w_{dt,te}(t)$ denotes a coefficient representing a cumulative influence quantity of tunneling and thermionic emission. It is assumed here that writing in the memory cell is performed in an ascending order in the word line direction.

As described above, according to the cell-to-cell interference, the read-target memory cell is affected by adjacent memory cells to which writing has been performed later. Thus, in the above expression (4), only the influence from threshold voltage of a memory cell located on a word line (y+1) on the same bit line is taken into consideration.

Figure 5:
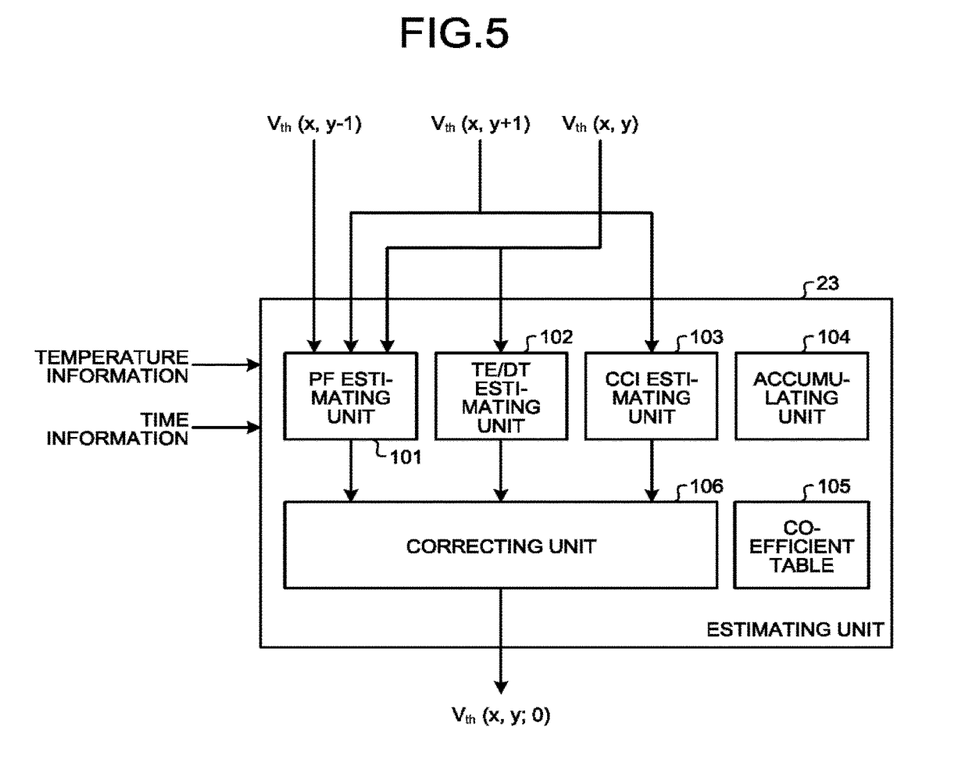
FIG. 5 is a block diagram illustrating a configuration example of an estimating unit.

FIG. 5 is a block diagram illustrating a configuration example of the estimating unit 23 according to the present embodiment. For example, as illustrated in FIG. 5, the estimating unit 23 includes a PF estimating unit 101, a TE/DT estimating unit 102, a CCI estimating unit 103, an accumulating unit. 104, a coefficient table 105, and a correcting unit 106. In the following descriptions, it is assumed that a memory cell (x, y) is selected by the selecting unit 21 as a read-target memory cell, and the detecting unit 22 has detected a threshold voltage at the time of reading the read-target memory cell (x, y) (a first threshold voltage) and threshold voltages at the time of reading adjacent memory cells (x, y−1) and (x, y+1) that affect the threshold voltage of the read-target memory cell (x, y) (a second threshold voltage).

Not only a threshold voltage $V_{th}(x, y)$ of the read-target memory cell detected by the detecting unit 22, but also threshold voltages $V_{th}(x, y-1)$ and $V_{th}(x, y+1)$ of the adjacent memory cells (x, y−1) and (x, y+1) detected by the detecting unit 22 are simultaneously input to the estimating unit 23. Temperature information representing the temperature of the memory cell and time information representing an elapsed time since the time of writing are also input to the estimating unit 23. The estimating unit 23 estimates a third threshold voltage $V_{th}(x, y;0)$, which is a threshold voltage at the time of writing in the read-target memory cell (x, y) by using the respective input threshold voltages, the temperature information, and the time information.

In the coefficient table 105, coefficient information required to estimate influence quantities of Poole-Frenkel emission, tunneling, thermionic emission, and cell-to-cell interference (CCI) by the respective estimating units 101, 102, and 103 has been recorded in advance. The coefficient table 105 can be easily obtained by writing various pieces of data in advance to, for example, a single NAND flash memory 2 under various temperature environments and checking time-dependent change and interference amount.

The accumulating unit 104 accumulates information to be used for estimation of the influence quantity by the respective estimating units 101, 102, and 103 based on the temperature information and the time information input thereto. For example, as indicated by the expression described above, in the thermionic emission, the amount of the current sensitively changes with respect to the temperature. Accordingly, for example, after the elapsed time since the threshold voltage is written into the memory cell is normalized by a predetermined temperature (for example, 0° C.), the elapsed time is accumulated in the accumulating unit 104. The information to be accumulated in the accumulating unit 104 is not limited thereto, and various pieces of information effective in estimation of the influence quantity by the respective estimating units 101, 102, and 103 can be used.

The PF estimating unit 101 estimates how much the threshold voltage of the read-target memory cell (x, y) has been varied due to Poole-Frenkel emission, and outputs the estimated variation amount as a PF correction value. As indicated by the above expression (3), the current density due to Poole-Frenkel emission sensitively changes with respect to threshold voltage differences between adjacent memory cells and the read-target memory cell itself. The threshold voltage difference attenuates over time with a certain time constant τ under a constant temperature environment. Accordingly, by referring to the information of the accumulating unit 104 and the information of the coefficient table 105, the threshold voltage differences between the read-target memory cell and adjacent memory cells at the time of writing can be estimated based on the threshold voltage differences between the read-target memory cell and the adjacent memory cells at present (at the time of reading). As indicated in the above expression (4), the PF estimating unit 101 obtains the threshold voltage differences at the time of writing and a coefficient $w_{pf}(t)$ indicating the influence quantity of Poole-Frenkel emission from the accumulating unit 104 and the coefficient table 105 to estimate how much the threshold voltage of the read-target memory cell (x, y) has been varied due to Poole-Frenkel emission, and outputs the estimated variation amount as the PF correction value.

The TE/DT estimating unit 102 estimates an variation amount of the threshold voltage of the read-target memory cell (x, y) varied due to the thermionic emission and the tunneling based on the present threshold voltage (at the time of reading) of the read-target memory cell (x, y) and the information in the accumulating unit 104 and the coefficient table 105, and outputs the estimated variation amount as a TE/DT correction value. Because an estimating method of the threshold voltage variation amount is the same as the estimating method of the threshold voltage variation amount by the PF estimating unit 101, descriptions thereof are omitted here.

The CCI estimating unit 103 estimates a threshold voltage variation amount due to the cell-to-cell interference (CCI), and outputs the estimated variation amount as a CCI correction value. The cell-to-cell interference (CCI) makes greater influence as the write threshold voltage into adjacent memory cells increases. As indicated by the above expression (4), in the present embodiment, it is assumed that a proportional relation is established between the write threshold voltage into adjacent memory cells and the threshold voltage variation amount. Therefore, if the threshold voltage variation in the adjacent memory cells is ignored, the threshold voltage variation amount due to the cell-to-cell interference (CCI) is approximately calculated by multiplying the threshold voltage of the adjacent memory cell (x, y+1) by a coefficient $w_{cci}$ held in the coefficient table 105.

The correcting unit 106 adds the correction values (the PF correction value, the TE/DT correction value, and the CCI correction value) obtained by the respective estimating units 101, 102, and 103 to the (present) threshold voltage $V_{th}(x, y)$ at the time of reading of the read-target memory cell (x, y) to obtain an estimate value of the threshold voltage $V_{th}(x, y;0)$ at the time of writing in the read-target memory cell (x, y).

Figure 6:
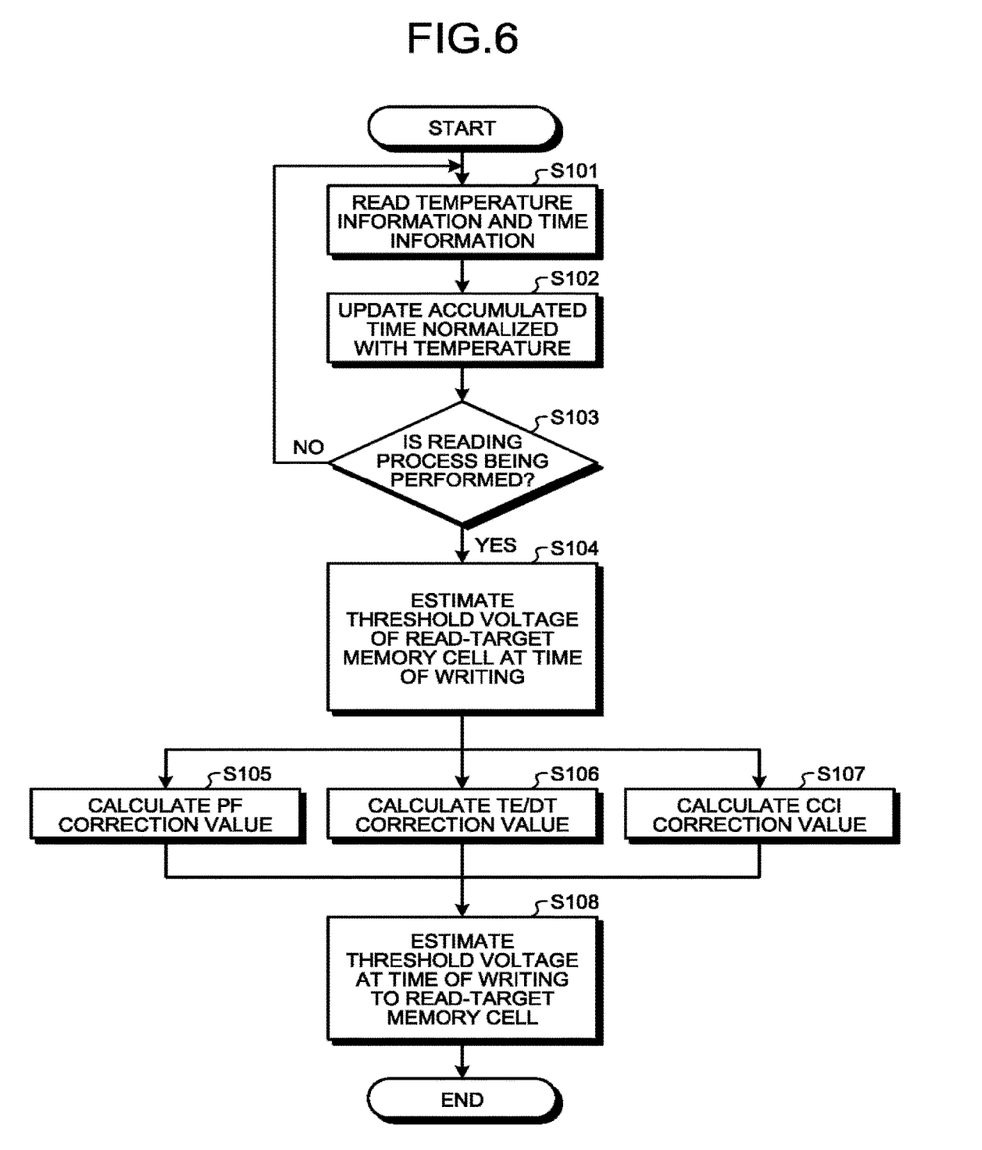
FIG. 6 is a flowchart illustrating an example of a process procedure performed by the estimating unit.

FIG. 6 is a flowchart illustrating an example of a process procedure performed by the estimating unit 23. When the process is started, the estimating unit 23 reads temperature information and time information input to the estimating unit 23 (Step S101), and calculates the time information to be independently forwarded for each of the estimating units 101, 102, and 103 based on the read temperature information, thereby updating the accumulated time normalized with a temperature (Step S102).

The estimating unit 23 then determines whether the reading process is being performed (Step S103), and if the reading process is not being performed (NO at Step S103), the estimating unit 23 returns to Step S101 to continue update of the accumulated time. If the reading process is being performed (YES at Step S103), the estimating unit 23 acquires the present threshold voltages of the read-target memory cell and adjacent memory cells detected by the detecting unit 22 (Step S104). The PF estimating unit 101, the TE/DT estimating unit 102, and the CCI estimating unit 103 respectively calculate the PF correction value, the TE/DT correction value, and the CCI correction value as described above (Steps S105, S106, and S107).

The correcting unit 106 then adds the PF correction value calculated at Step S105, the TE/DT correction value calculated at Step S106, and the CCI correction value calculated at Step S107 to the present threshold voltage of the read-target memory cell acquired at Step S104, thereby estimating the threshold voltage at the time of writing in the read-target memory cell (Step S108).

In the NAND controller 5 according to the present embodiment, during execution of the reading process performed by the reading unit 20, selection of the read-target memory cell performed by the selecting unit 21, detection of the (present) threshold voltage at the time of reading of the read-target memory cell and adjacent memory cells performed by the detecting unit 22, and estimation of the threshold voltage at the time of writing in the read-target memory cell performed by the estimating unit 23 are repeatedly performed sequentially with respect to the memory cells to be read in the NAND flash memory 2 which contains uncorrectable errors. Consequently, its error rate can be lowered.

As described above in detail with reference to the specific examples, in the data storage device 1 according to the present embodiment, at data reading, the NAND controller 5 of the controller 3 corrects a threshold voltage at the time of reading of the read-target memory cell by talking the relation of threshold voltages between a read-target memory cell and adjacent memory cells into consideration to estimate the threshold voltage at the time of writing, according to the threshold-voltage variation model represented in the above expression (4). Accordingly, the threshold voltage at the time of writing in the read-target memory cell can be accurately estimated by cancelling variation of the threshold voltage due to various factors, and the reliability of the data storage device 1 can be improved.

In the example described above, the explanation has been given regarding correction of threshold voltages based on four physical phenomena: Poole-Frenkel emission, thermionic emission, tunneling, and cell-to-cell interference (CCI). Alternatively, threshold voltages can be corrected based on a type of disturb. For example, regarding the read disturb described above, the number of times of reading a block to which a memory cell belongs is counted, and the variation amount of the threshold voltage can be estimated according to the amount of the counted number. Further, regarding the program disturb and the pass disturb, by expanding a process illustrated as the process of the CCI estimating unit 103 to cover the memory cells contributing to both the program disturb and the pass disturb, the threshold-voltage variation amount can be easily calculated.

Furthermore, in the present embodiment, the influence of cell-to-cell interference (CCI) has been described while limiting to one adjacent memory cell. However, estimation taking the influence from a plurality of adjacent memory cells into consideration can be performed by setting an independent coefficient corresponding to the distance and writing order for each adjacent memory.

Second Embodiment

A second embodiment is described next. A method of estimating the threshold voltage at the time of writing in a read-target memory cell (the third threshold voltage) according to the present embodiment is different from that of the first embodiment. That is, in the present embodiment, the reading unit 20 of the NAND controller 5 includes an estimating unit 24 illustrated in FIG. 7, instead of the estimating unit 23 illustrated in FIG. 5. In the present embodiment, the writing unit 10 of the NAND controller 5 has a function of writing reference data to be used for deciding model parameters described later in the NAND flash memory 2, in addition to user data. Other configurations of the present embodiment are identical to those of the first embodiment described above. In the following descriptions, explanations redundant to the first embodiment are appropriately omitted, and only differences from the first embodiment are described.

Figure 7:
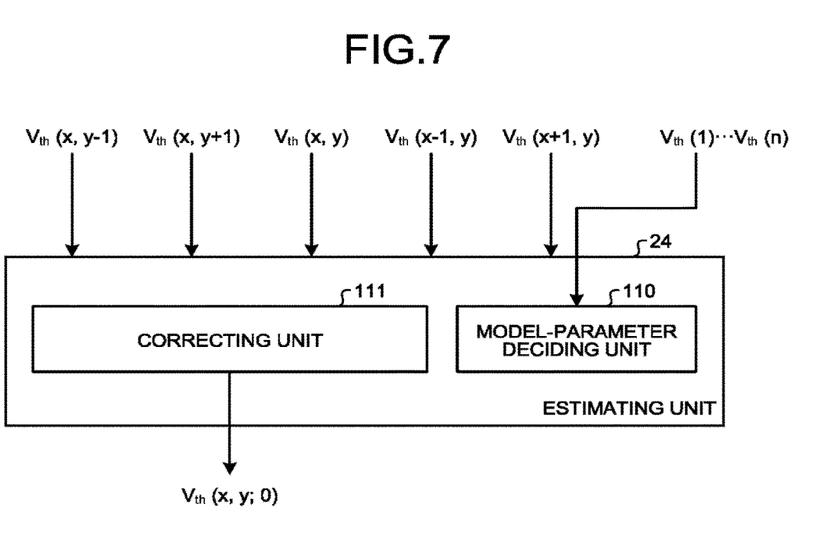
FIG. 7 is a block diagram illustrating a configuration example of the estimating unit.

FIG. 7 is a block diagram illustrating a configuration example of the estimating unit 24 according to the present embodiment. For example, as illustrated in FIG. 7, the estimating unit 24 includes a model-parameter deciding unit 110 and a correcting unit 111. The temperature information and the time information are not input to the estimating unit 24, instead, a reference threshold-voltage group of $V_{th}(1), \ldots,$ and $V_{th}(n)$ at the time of reading is input to the estimating unit 24 according to the present embodiment. The reference threshold-voltage group of $V_{th}(1), \ldots,$ and $V_{th}(n)$ is a threshold voltage group corresponding to the reference data written together at the time of writing of the user data by the writing unit 10 of the NAND controller 5, and is a threshold voltage group that is predicted to vary from the time of writing due to various factors. The reference threshold-voltage group of $V_{th}(1), \ldots,$ and $V_{th}(n)$ at the time of reading is read by the detecting unit 22 at the time of reading of the written user data, and input to the estimating unit 24.

The reference data is a predetermined data pattern and is stored at the timing of writing user data. The reference data and the user data share the same word line in the memory array 9. Accordingly, with respect to the reference data, threshold voltages (hereinafter, "reference threshold-voltage group") are known at both the time of writing and reading.

Figure 8:
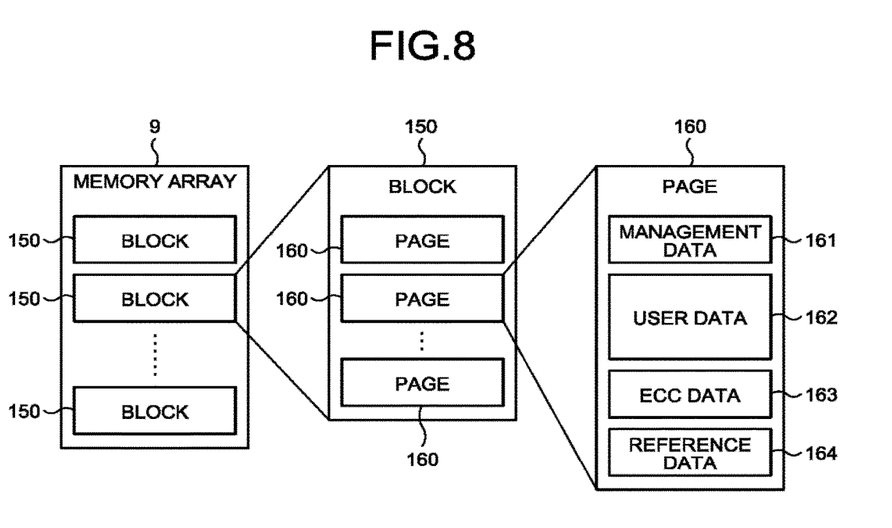

FIG. 8 is an explanatory diagram of a data storage structure of the memory array 9 in the NAND flash memory 2. The memory array 9 in the NAND flash memory 2 generally includes a plurality of blocks 150, and the block 150 includes a plurality of pages 160. Writing in the NAND flash memory 2 is performed in a unit of page 160, and one page 160 generally includes management data 161, user data 162, and ECC data (error correction code) 163. In the present embodiment, reference data 164 is also added as data to be written in the page 160.

For example, as the reference data 164, random number can be used or a preset data pattern can be used. When the preset data pattern is used as the reference data 164, it is desired that the memory cell group in which the reference data 164 is written includes various patterns in a difference in the threshold voltage between adjacent memory cells or in the threshold voltage itself. When random number data is used as the reference data 164, the written random number data have to be regenerated at the time of reading of the written user data.

In the estimating unit 24 according to the present embodiment, the model-parameter deciding unit 110 decides model parameters of a threshold-voltage variation model based on a relation between the reference threshold-voltage group of $V_{th}(1), \ldots,$ and $V_{th}(n)$ at the time of reading detected by the detecting unit 22 and the known reference threshold-voltage group at the time of writing corresponding to the reference data. The correcting unit 111 estimates the threshold voltage at the time of writing in the read-target memory cell based on the present threshold voltages of the read-target memory cell and adjacent memory cells detected by the detecting unit 22 (at the time of reading) by using the threshold-voltage variation model whose model parameters have been decided.

Figure 9:
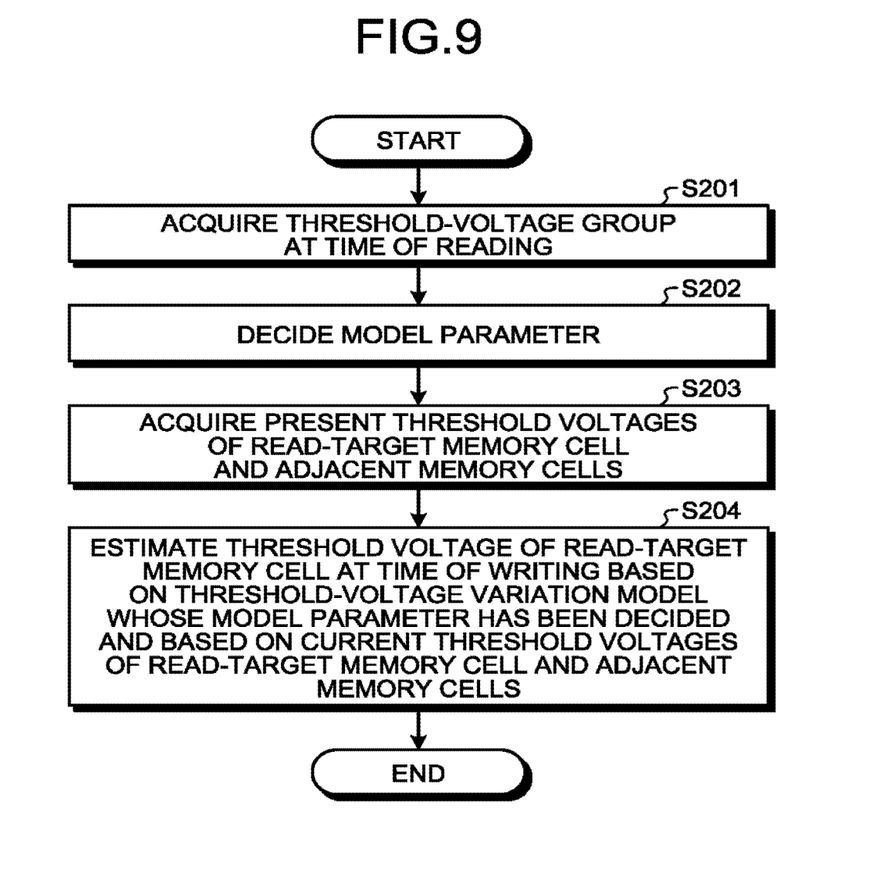
FIG. 9 is a flowchart indicating an example of a process procedure performed by the estimating unit.

An operation of the estimating unit 24 according to the present embodiment is described according to the flowchart in FIG. 9. FIG. 9 is a flowchart indicating an example of a process procedure performed by the estimating unit 24. When a process is started, the estimating unit 24 acquires the reference threshold-voltage group of $V_{th}(1), \ldots,$ and $V_{th}(n)$ at the time of reading detected by the detecting unit 22 (Step S201). The model-parameter deciding unit 110 decides model parameters of the threshold-voltage variation model based on a relation between the reference threshold-voltage group of $V_{th}(1), \ldots,$ and $V_{th}(n)$ at the time of reading acquired at Step S201 and the known reference threshold-voltage group at the time of writing corresponding to the reference data (Step S202).

By classifying the threshold-voltage variation model represented in the above expression (4) into a term affected by the threshold voltage itself of an adjacent memory cell, a term affected by a difference in the threshold voltage between the adjacent memory cell and a read-target memory cell, and a term affected only by the threshold voltage of the read-target memory cell, the threshold-voltage variation model can be expressed by the following expression (5).

$$V_{th}(x, y; t) = \sum_{(i,j) \in CC(x,y)} (w_{cc}(i, j; t) V_{th}(i, j; 0)) + \qquad (5)$$
$$\sum_{(i,j) \in DIFF(x,y)} (w_{df}(i, j; t)(V_{th}(i, j; 0) - V_{th}(x, y; 0))) +$$
$$w_s(t) V_{th}(x, y; 0)$$

In this expression, CC(x, y) is an adjacent memory cell that is adjacent to the read-target memory cell (x, y) and represents a set of the memory cells in which the threshold voltages thereof affect the threshold voltage of the read-target memory cell (x, y). Typically, the CC(x, y) is one memory cell in which data is written after writing in the read-target memory cell (x, y), of two memory cells located on an adjacent word line and on the same bit line with respect to the read-target memory cell (x, y), and affects the threshold voltage of the read-target memory cell (x, y) due to the cell-to-cell interference (CCI). DIFF(x, y) is an adjacent memory cell that is adjacent to the read-target memory cell (x, y), and represents a set of the memory cells in which the difference between the threshold voltage thereof and the threshold voltage of the read-target memory cell (x, y) affects the threshold voltage of the read-target memory cell (x, y). Typically, two memory cells located on the adjacent word line and on the same bit line with respect to the read-target memory cell (x, y) correspond to the DIFF(x, y), and affect the threshold voltage of the read-target memory cell (x, y) due to Poole-Frenkel emission described above. $w_{cc}(i, j; t)$, $w_{df}(i, j; t)$, and $w_s(t)$ are respective weight coefficients thereof, and typically correspond to $w_{cci}$, $w_{pf}(t)$, and $w_{dt,te}(t)$ in the expression (4) described above. The model parameters of the threshold-voltage variation model decided at Step S202 means these weight coefficients $w_{cc}(i, j; t)$, $w_{df}(i, j; t)$, and $w_s(t)$.

The threshold voltage (the reference threshold voltage at the time of reading) of a memory cell at a time t in which an m-th (m=1, ..., M) value included in the reference data has been written is expressed as $V_{th}(m;t)$, the threshold voltage of a set of K memory cells expressed by CC (x, y) at the time t is expressed as $V_{th}(m, k;t)$, and a difference between the threshold voltage of a set of L memory cells expressed by DIFF(x, y) and $V_{th}(m;t)$ is expressed as $\Delta V_{th}(m, l;t)$. At this time, the above expression (5) can be replaced as the following expression (6).

$$V_{th}(m; t) = \qquad (6)$$
$$\sum_{k=1}^{K}(w_{cc}(k; t)V_{th}(m, k; 0)) + \sum_{l=1}^{L} w_{df}(l; t)\Delta V_{th}(m, l; 0) + w_s(t)V_{th}(m; 0)$$

A model formula of the M reference threshold voltages $V_{th}(1;t), \ldots,$ and $V_{th}(M;t)$ at the time of reading can be expressed as the following matrix equation (7).

$$\begin{bmatrix} V_{th}(1; t) \\ V_{th}(2; t) \\ \vdots \\ V_{th}(M; t) \end{bmatrix} = \qquad (7)$$

$$\begin{bmatrix} V_{th1}(1, 1; 0) & \ldots & V_{th1}(1, K; 0) & \Delta V_{th}(1, 1; 0) & \ldots & \Delta V_{th}(1, L; 0) & V_{th1}(1; 0) \\ V_{th2}(2, 1; 0) & \ldots & V_{th1}(2, K; 0) & \Delta V_{th}(2, 1; 0) & \ldots & \Delta V_{th}(2, L; 0) & V_{th1}(2; 0) \\ \vdots & & \vdots & \vdots & & \vdots & \vdots \\ V_{th(n)}(M, 1; 0) & \ldots & V_{th1}(M, K; 0) & \Delta V_{th}(M, 1; 0) & \ldots & \Delta V_{th}(M, L; 0) & V_{th1}(M; 0) \end{bmatrix} \begin{bmatrix} W_{cc}(1; t) \\ \vdots \\ W_{cc}(K; t) \\ W_{df}(1; t) \\ \vdots \\ W_{df}(L; t) \\ W_s(t) \end{bmatrix}$$

When M is sufficiently large, the respective weight coefficients $w_{cc}$, $w_{df}$, and $w_s$ can be estimated with high accuracy by a least-squares method that minimizes L2 norm of a difference between a right side and a left side of the above expression (7).

After having decided the model parameters (respective weight coefficients $w_{cc}$, $w_{df}$, and $w_s$) of the threshold-voltage variation model as described above, the estimating unit 24 acquires present threshold voltages of the read-target memory cell and adjacent memory cells detected by the detecting unit 22 (Step S203). The correcting unit 111 estimates the threshold voltage at the time of writing in the read-target memory cell based on the threshold-voltage variation model represented in the above expression (5) and the present threshold voltages of the read-target memory cell and the adjacent memory cells acquired at Step S203 (Step S204).

Specifically, an inverse model is generated by transforming the above expression (5), and the threshold voltages acquired at Step S203 are substituted in the inverse model, thereby correcting the present threshold voltage of the read-target memory cell to estimate the threshold voltage at the time of writing. As the most basic example, when an inverse model is derived for an interference model of two memory cells adjacent to each other represented in the following expressions (8) and (9), the following expressions (10) and (11) can be established.

$$V_{th}(1;t) = \qquad (8)$$
$$w_{cc}(t)V_{th}(2;0) + w_{df}(t)(V_{th}(2;0) - V_{th}(1;0)) + w_s(t)V_{th}(1;0)$$

$$V_{th}(2;t) = w_{df}(t)(V_{th}(1;0) - V_{th}(2;0)) + w_s(t)V_{th}(2;0) \qquad (9)$$

$$V_{th}(1;0) = \frac{(w_{df}(t) - w_s(t))V_{th}(1;t) + (w_{cc}(t) + w_{df}(t))V_{th}(2;t)}{w_{cc}(t)w_{df}(t) + 2w_{df}(t)w_s(t) - w_s^2(t)} \qquad (10)$$

$$V_{th}(2;0) = \frac{w_{df}(t)V_{th}(1;t) + (w_{df}(t) - w_s(t))V_{th}(2;t)}{w_{cc}(t)w_{df}(t) + 2w_{df}(t)w_s(t) - w_s^2(t)} \qquad (11)$$

In this way, the inverse model can be obtained by solving simultaneous equations.

As described above, also in the present embodiment, the threshold voltage at the time of writing in a read-target memory cell can be estimated by correcting the threshold voltage at the time of reading of the read-target memory cell, taking the relation of threshold voltages between the read-target memory cell and adjacent memory cells into consideration. Accordingly, the threshold voltage at the time of writing in the read-target memory cell can be accurately estimated by canceling variations of the threshold voltage due to various factors, and an error rate can be decreased.

Further, according to the present embodiment, the model parameters of a threshold-voltage variation model is decided based on a relation between the reference threshold-voltage group at the time of reading and a known reference threshold-voltage group at the time of writing without using temperature information and time information, and the threshold voltage at the time of writing in a read-target memory cell is estimated by using the threshold-voltage variation model whose model parameters have been decided. Therefore, the threshold voltage at the time of writing in the read-target memory cell can be estimated more easily.

In the above example, while a threshold-voltage variation model is expressed by a primary expression relating to a threshold voltage, a more appropriate threshold-voltage variation model can be expressed by an n-th order polynomial.

In the simultaneous equations represented in the above expression (8), the member thereof increases and the calculation thereof becomes more complicated, as the number of memory cells as a variable increases. However, if the model formula represented in the above expression (5) is replaced by an approximation formula, the complexity can be suppressed. For example, when the model represented in the above expression (8) is expanded to three memory cells, the following expressions (12) to (14) are obtained, and the inverse model becomes complicated as represented in the following expressions (15) to (19).

$$V_{th}(1;t) = \qquad (12)$$
$$w_{cc}(t)V_{th}(2;0) + w_{df}(t)(V_{th}(2;0) - V_{th}(1;0)) + w_s(t)V_{th}(1;0)$$

$$V_{th}(2;t) = w_{cc}(t)V_{th}(3;0) + \qquad (13)$$
$$w_{df}(t)(V_{th}(3;0) + V_{th}(1;0) - 2V_{th}(2;0)) + w_s(t)V_{th}(2;0)$$

$$V_{th}(3;t) = w_{df}(t)(V_{th}(2;0) - V_{th}(3;0)) + w_s(t)V_{th}(3;0) \qquad (14)$$

$$V_{th}(1;0) = \frac{A}{(w_{df}(t) - w_s(t))(2w_{cc}(t)w_{df}(t) + 3w_{df}(t)w_s(t) - w_s(t)^2)} \qquad (15)$$

$$A = (w_{df}(t)^2 - w_{cc}(t)w_{df}(T) - 3w_{df}(t)w_s(t) + w_s(t)^2)V_{th}(1;t) + \qquad (16)$$
$$(w_{cc}(t)w_{df}(t) - w_{cc}(t)w_s(t) + w_{df}(t)^2 - w_{df}(t)w_s(t))V_{th}(2;t) +$$
$$(w_{cc}(t)^2 + 2w_{cc}(t)w_{df}(t) + w_{df}(t)^2)V_{th}(3;0)$$

$$V_{th}(2;0) = \frac{\begin{pmatrix} w_{df}(t)V_{th}(1;t) + (w_{df}(t) - w_s(t))V_{th}(2;t) + \\ (w_{cc}(t) + w_{df}(t))V_{th}(3;t) \end{pmatrix}}{w_s(t)^2 + 2w_{cc}(t)w_{df}(t) - 3w_{df}(t)w_s(t)} \qquad (17)$$

$$V_{th}(3;0) = \frac{B}{(w_{df}(t) - w_s(t))(2w_{cc}(t)w_{df}(t) + 3w_{df}(t)w_s(t) - w_s(t)^2)} \qquad (18)$$

$$B = w_{df}(t)^2 V_{th}(1;0) + (w_{df}(t)^2 - w_{df}(t)w_s(t))V_{th}(2;0) + \qquad (19)$$
$$(w_{df}(t)^2 + w_s(t)^2 - w_{cc}(t)w_{df}(t) - 3w_{df}(t)w_s(t))V_{th}(3;0)$$

By setting the threshold-voltage variation model and the inverse model to be used at Steps S202 and S204 in the flowchart in FIG. 9 as a set of the models limited to a relation between two memory cells represented in the above expressions (8) and (9) (the model is generated for adjacent memory cells affecting a read-target memory cell), and as an approximate solution expressed by weighted addition, the complexity can be decreased considerably.

Additional Explanation

The writing unit 10, the reading unit 20 (the selecting unit 21, the detecting unit 22, and the estimating unit 23), and the FCC processing unit 30 included in the NAND controller 5 (the controller 3) are implemented by, for example, one processor or a plurality of processors. For example, each of the elements described above can be implemented by causing a processor such as a central processing unit (CPU) to execute a program, that is, can be implemented by software. Further, each of the elements can be implemented by a processor such as a dedicated integrated circuit (IC), that is, can be implemented by hardware. Furthermore, each of the elements can be also realized by using software and hardware simultaneously. When a plurality of processors are used, each of the processors can realize one of the elements, or can realize two or more of the elements.

According to at least one of the embodiments described above, good error suppression can be realized even with respect to a NAND flash memory having variations in the error rate for each bit due to an influence of the threshold voltage of adjacent memory cells.

While a certain embodiment has been described, the embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A memory controller comprising:
one or more processors configured to function as:
a writing unit configured to write data as threshold voltages of individual memory cells of a memory cell group; and
a reading unit configured to read the written data by detecting threshold voltages of the individual memory cell of the memory cell group, wherein
the reading unit includes
a selecting unit configured to select a read-target memory cell,
a detecting unit configured to detect a first threshold voltage as a threshold voltage at a time of reading of the read-target memory cell, and a second threshold voltage as a threshold voltage at a time of reading of at least one of adjacent memory cells that are adjacent to the read-target memory cell, and
an estimating unit configured to estimate a third threshold voltage as a threshold voltage at a time of writing in the read-target memory cell based on the first threshold voltage and the second threshold voltage.

2. The controller according to claim 1, wherein the adjacent memory cells includes a memory cell that shares a bit line with the read-target memory cell and is physically adjacent to the read-target memory cell.

3. The controller according to claim 1, wherein the estimating unit estimates the third threshold voltage based on a threshold-voltage variation model representing a variation of the third threshold voltage due to a relation between the read-target memory cell and the adjacent memory cells, the first threshold voltage, and the second threshold voltage.

4. The controller according to claim 3, wherein the threshold-voltage variation model includes
a term for obtaining a variation of the third threshold voltage corresponding to a magnitude of the third threshold voltage,
a term for obtaining a variation of the third threshold voltage corresponding to a magnitude of a threshold voltage at the time of writing in the adjacent memory cell, and
a term for obtaining a variation of the third threshold voltage corresponding to a difference between the threshold voltage at the time of writing in the adjacent memory cell and the third threshold voltage.

5. The controller according to claim 3, wherein the threshold-voltage variation model has a characteristic such that the third threshold voltage varies with passage of time, and a characteristic such that a variation of the third threshold voltage increases as a difference between the threshold voltage at the time of writing in the adjacent memory cell and the third threshold voltage increases.

6. The controller according to claim 3, wherein the estimating unit acquires temperature information representing a temperature of a memory cell and time information representing an elapsed time since a time of writing, and estimates the third threshold voltage based on the temperature information, the time information, the threshold-voltage variation model, the first threshold voltage, and the second threshold voltage.

7. The controller according to claim 3, wherein
the writing unit further writes predetermined reference data in a memory cell group other than a memory cell group in which the written data is written,
the detecting unit further detects a reference threshold-voltage group at a time of reading, which is a set of threshold voltages at a time of reading of individual memory cells of the memory cell group in which the reference data has been written, and
the estimating unit decides a model parameter of the threshold-voltage variation model based on a relation between the reference threshold-voltage group at a time of reading and a reference threshold-voltage group at a time of writing, which is a set of known threshold voltages at a time of writing corresponding to the reference data, and estimates the third threshold voltage based on the first threshold voltage, the second threshold voltage, and the threshold-voltage variation model whose model parameter has been decided.

8. The controller according to claim 7, wherein the reference data is a data pattern based on a random number.

9. A data reading method of detecting a threshold voltage of individual memory cells of a memory cell group from a memory in which data is written as threshold voltages of the individual memory cells of the memory cell group to read the written data,
the method comprising:
selecting a read-target memory cell;
detecting a first threshold voltage as a threshold voltage at a time of reading of the read-target memory cell, and a second threshold voltage as a threshold voltage at a time of reading of at least one of adjacent memory cells that are adjacent to the read-target memory cell; and
estimating a third threshold voltage as a threshold voltage at a time of writing in the read-target memory cell based on the first threshold voltage and the second threshold voltage.

* * * * *